(12) United States Patent
Li et al.

(10) Patent No.: US 11,448,685 B2
(45) Date of Patent: Sep. 20, 2022

(54) DEVICE AND METHOD FOR TESTING SEMICONDUCTOR DEVICES

(71) Applicant: INNOSCIENCE (ZHUHAI) TECHNOLOGY CO., LTD., Zhuhai (CN)

(72) Inventors: Jihua Li, Zhuhai (CN); Tao Zhang, Zhuhai (CN); Wenjie Lin, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 75 days.

(21) Appl. No.: 16/981,704

(22) PCT Filed: Aug. 6, 2020

(86) PCT No.: PCT/CN2020/107412
§ 371 (c)(1),
(2) Date: Sep. 17, 2020

(87) PCT Pub. No.: WO2022/027438
PCT Pub. Date: Feb. 10, 2022

(65) Prior Publication Data
US 2022/0043048 A1    Feb. 10, 2022

(51) Int. Cl.
*G01R 31/26* (2020.01)

(52) U.S. Cl.
CPC ..... *G01R 31/2623* (2013.01); *G01R 31/2617* (2013.01); *G01R 31/2633* (2013.01)

(58) Field of Classification Search
CPC ............ G01R 31/2617; G01R 31/2623; G01R 31/2633; G01R 27/2605; H02M 3/156;
(Continued)

(56) References Cited

U.S. PATENT DOCUMENTS

| 2011/0127927 A1* | 6/2011 | Chen ................... H05B 31/50 315/294 |
| 2012/0062323 A1* | 3/2012 | Le Gallou ............. H03F 1/0222 330/297 |

(Continued)

FOREIGN PATENT DOCUMENTS

| CN | 1713497 A | 12/2005 |
| CN | 102474180 A | 5/2012 |

(Continued)

OTHER PUBLICATIONS

International Search Report and Written Opinion of the corresponding PCT application No. PCT/CN2020/107412 dated Apr. 29, 2021.

*Primary Examiner* — Thang X Le
(74) *Attorney, Agent, or Firm* — Idea Intellectual Limited; Margaret A. Burke; Sam T. Yip

(57) ABSTRACT

A testing circuit includes a first circuit and a second circuit. The first circuit has a first capacitor and a second capacitor. The first circuit is configured to transfer at least a portion of a first voltage across the first capacitor to the second capacitor. The second circuit has the first capacitor and the second capacitor. The second circuit is configured to transfer at least a portion of a second voltage across the second capacitor to the first capacitor.

17 Claims, 9 Drawing Sheets

(58) Field of Classification Search
CPC ... H02M 3/1563; H02M 3/157; H02M 3/1582
See application file for complete search history.

(56) References Cited

U.S. PATENT DOCUMENTS

| | | | |
|---|---|---|---|
| 2013/0021015 A1* | 1/2013 | Moussaoui | H02M 3/1582 |
| | | | 323/311 |
| 2019/0181755 A1* | 6/2019 | Swamy | H02M 3/1582 |
| 2019/0199226 A1* | 6/2019 | Huang Zhan | H02M 3/1582 |
| 2019/0267886 A1* | 8/2019 | Hung | H02M 3/33569 |
| 2020/0144909 A1* | 5/2020 | Baek | H02M 3/07 |

FOREIGN PATENT DOCUMENTS

| | | |
|---|---|---|
| CN | 101369775 B | 10/2012 |
| CN | 103378635 A | 10/2013 |
| WO | 2013167579 A1 | 11/2013 |
| WO | 2016191104 A1 | 12/2016 |

* cited by examiner

DEVICE AND METHOD FOR TESTING SEMICONDUCTOR DEVICES

BACKGROUND

1. Field of the Disclosure

The disclosure relates to a device for testing semiconductor devices and a method for operating the same.

2. Description of the Related Art

Reliability is important for semiconductor devices. To ensure safety and reliability, various tests may be performed on semiconductor devices under different temperatures, currents and voltages. In general, the buck circuit test and the boost circuit test are commonly used for testing semiconductor devices. In addition, the aging test can be performed to ensure the reliability of semiconductor devices during long-term operation. Furthermore, the switching safe operating area (SSOA) test can be performed to ensure the ability of semiconductor devices to withstand voltage and current stress during the switching process.

To perform various tests on a semiconductor device, many separate testing circuits might be used, which would increase the time, cost and complexity of testing the semiconductor device. Hence, it is desirable to provide a testing circuit and method to efficiently perform various tests on a semiconductor device.

SUMMARY

In some embodiments, a testing circuit includes a first circuit and a second circuit. The first circuit has a first capacitor and a second capacitor. The first circuit is configured to transfer at least a portion of a first voltage across the first capacitor to the second capacitor. The second circuit has the first capacitor and the second capacitor. The second circuit is configured to transfer at least a portion of a second voltage across the second capacitor to the first capacitor In some embodiments, a method for testing a first transistor and a second transistor includes performing a boost circuit test for the first transistor during a first time period by transferring at least a portion of a first voltage of a first capacitor to a second capacitor; and performing a buck circuit test for the second transistor during a second time period by transferring at least a portion of a second voltage of the second capacitor to the first capacitor.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
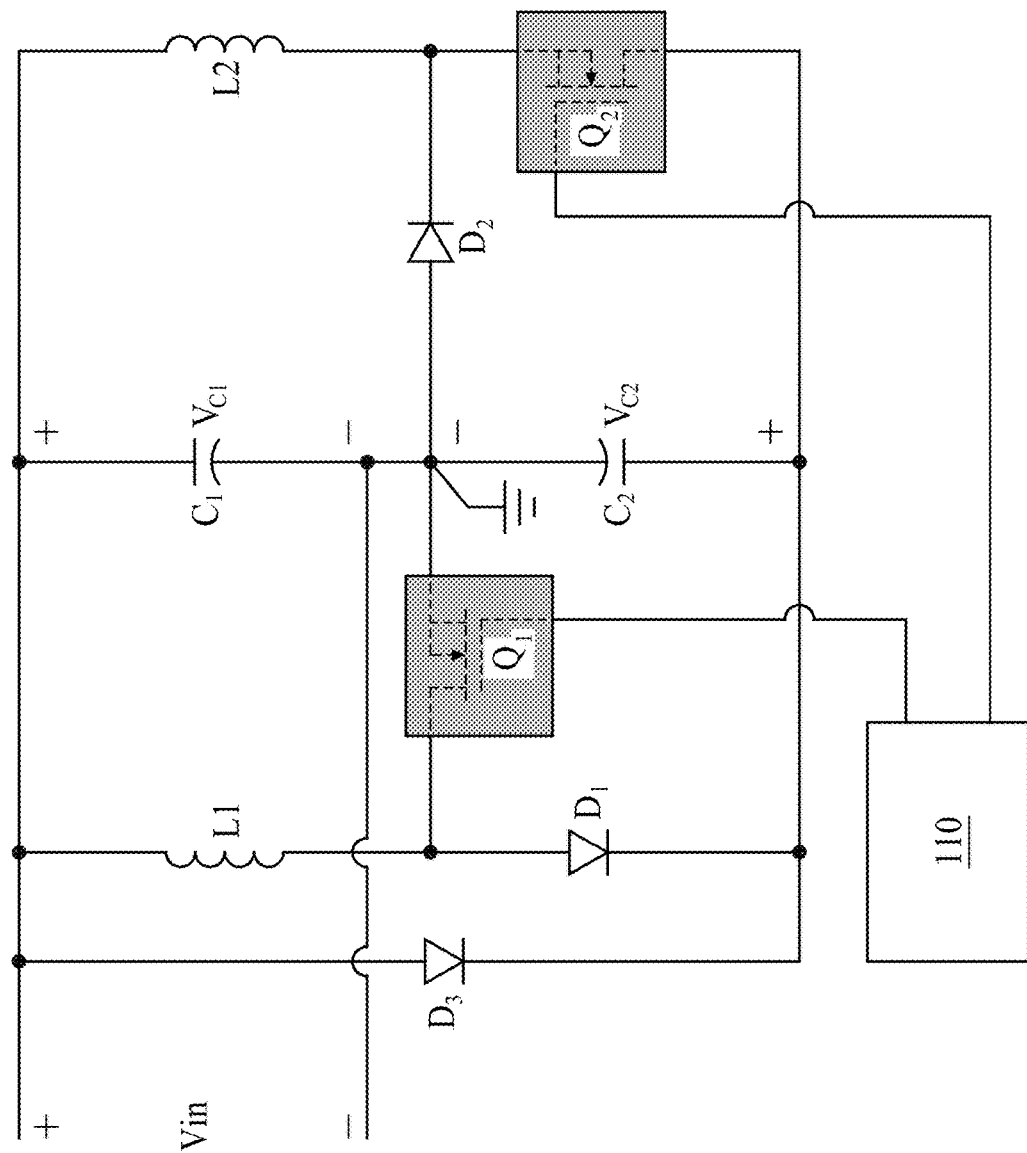
FIG. 1 illustrates a schematic diagram of a testing circuit, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a schematic diagram of a testing circuit 100, in accordance with some embodiments of the present disclosure. The testing circuit 100 includes a controller 110, diodes D1, D2, D3, capacitors C1, C2 and inductors L1, L2. In some embodiments, the controller 110 may be separate from the testing circuit 100.

The testing circuit 100 is electrically connected to a device under test (DUT) and configured to perform various tests on the DUT. For example, as shown in FIG. 1, the testing circuit 100 is electrically connected to transistors Q1 and Q2, and configured to perform various tests on the transistors Q1 and Q2. In other embodiments, the transistors Q1 and Q2 can be replaced by any other semiconductor devices or electronic components to be tested.

In some embodiments, the transistors Q1 and Q2 may be or include direct bandgap material, such as an III-V compound, which includes but is not limited to, for example, gallium arsenide (GaAs), indium phosphide (InP), gallium nitride (GaN), indium gallium arsenide (InGaAs), aluminum gallium arsenide (AlGaAs), and others. For example, the transistors Q1 and Q2 may be or include GaN-based transistors. For example, the transistors Q1 and Q2 can include high-electron-mobility transistors (HEMTs). In other embodiments, the transistors Q1 and Q2 may be or include metal-oxide-semiconductor field-effect transistors (MOSFETs), bipolar junction transistors (BJTs), heterojunction bipolar junction transistors (HBTs), integrated bipolar-field effect transistors (BIFETs) or the like.

The transistor Q1 may have a gate, a drain and a source. The gate of the transistor Q1 is electrically connected to the controller 110 to receive signal from the controller 110. The drain of the transistor Q1 is electrically connected to the inductor L1 and an anode of the diode D1. The source of the transistor Q1 is electrically connected to ground. In some embodiments, the transistor Q1 may be or include a "normally-off" type of transistor. For example, in operation, if a voltage applied between the gate and the source of the transistor Q1 is equal to or greater than a threshold voltage of the transistor Q1, the transistor Q1 can be turned on to contact a current (e.g., from the drain to the source). If the voltage applied between the gate and the source of the transistor Q1 is less than the threshold voltage of the transistor Q1, the transistor Q1 would be turned off. In other embodiments, the transistor Q1 may be or include a "normally-on" type of transistor depending on different design specifications.

The transistor Q2 may have a gate, a drain and a source. The gate of the transistor Q2 is electrically connected to the controller 110 to receive signal from the controller 110. The source of the transistor Q2 is electrically connected to the inductor L2 and a cathode of the diode D2. The drain of the transistor Q2 is electrically connected to the capacitor C2, a cathode of the diode D1 and a cathode of the diode D3. In some embodiments, the transistor Q2 may be or include a "normally-off" type of transistor. For example, in operation, if a voltage applied between the gate and the source of the transistor Q2 is equal to or greater than a threshold voltage of the transistor Q2, the transistor Q2 can be turned on to contact a current (e.g., from the drain to the source). If the voltage applied between the gate and the source of the transistor Q2 is less than the threshold voltage of the transistor Q2, the transistor Q2 would be turned off. In other embodiments, the transistor Q2 may be or include a "normally-on" type of transistor depending on different design specifications.

The controller 110 is electrically connected to the gate of the transistor Q1 and the gate of the transistor Q2. The controller 110 may be configured to generate pulse width modulation (PWM) signal or any other suitable signals. For example, the controller 110 may be or include a PWM controller. The controller 110 is configured to send or transmit signal to the transistors Q1 and Q2 to turn on or turn off the transistors Q1 and Q2. In some embodiments, the signal transmitted to the gates of the transistors Q1 and Q2 can have the same logical value. In some embodiments, the signal transmitted to the gates of the transistors Q1 and Q2 may have different logical values.

The diode D3 is electrically connected between an input of the testing circuit 100 and the drain of the transistor Q2. For example, the diode D3 has an anode electrically connected to the input of the testing circuit 100 to receive an input voltage Vin (or an input current). The diode D3 has a cathode electrically connected to the drain of the transistor Q2. The cathode of the diode D3 is electrically connected a cathode of the diode D1. The cathode of the diode D3 is electrically connected to the capacitor C2. In the case that the voltage (i.e., the input voltage Vin minus the voltage VC2 across the capacitor C2) across the diode D3 is higher than the threshold voltage of the diode D3, the diode D3 is turned on to conduct current (i.e., the diode D3 is in forward bias). In the case that the voltage across the diode D3 is lower than the threshold voltage of the diode D3, the diode D3 is turned off (i.e., the diode D3 is in reverse bias).

The anode of the diode D1 is electrically connected to the inductor L1 and the drain of the transistor Q1. The cathode of the diode D1 is electrically connected to the cathode of the diode D3, the capacitor C2 and the drain of the transistor Q2. In the case that the voltage across the diode D1 is higher than the threshold voltage of the diode D1, the diode D1 is turned on to conduct current (i.e., the diode D1 is in forward bias). In the case that the voltage across the diode D1 is lower than the threshold voltage of the diode D1, the diode D1 is turned off (i.e., the diode D1 is in reverse bias).

The anode of the diode D2 is electrically connected to ground. The cathode of the diode D2 is electrically connected to the inductor L2 and the source of the transistor Q2. In the case that the voltage across the diode D2 is higher than the threshold voltage of the diode D2, the diode D2 is turned on to conduct current (i.e., the diode D2 is in forward bias). In the case that the voltage across the diode D2 is lower than the threshold voltage of the diode D2, the diode D2 is turned off (i.e., the diode D2 is in reverse bias).

The inductor L1 is electrically connected between the input of the testing circuit 100 and the drain of the transistor Q1. The inductor L2 is electrically connected between the input of the testing circuit 100 and the source of the transistor Q2. The capacitor C1 is electrically connected between the input of the testing circuit 100 and ground. The capacitor C2 is electrically connected between the cathode of the diode D3 and ground.

Figure 2A:
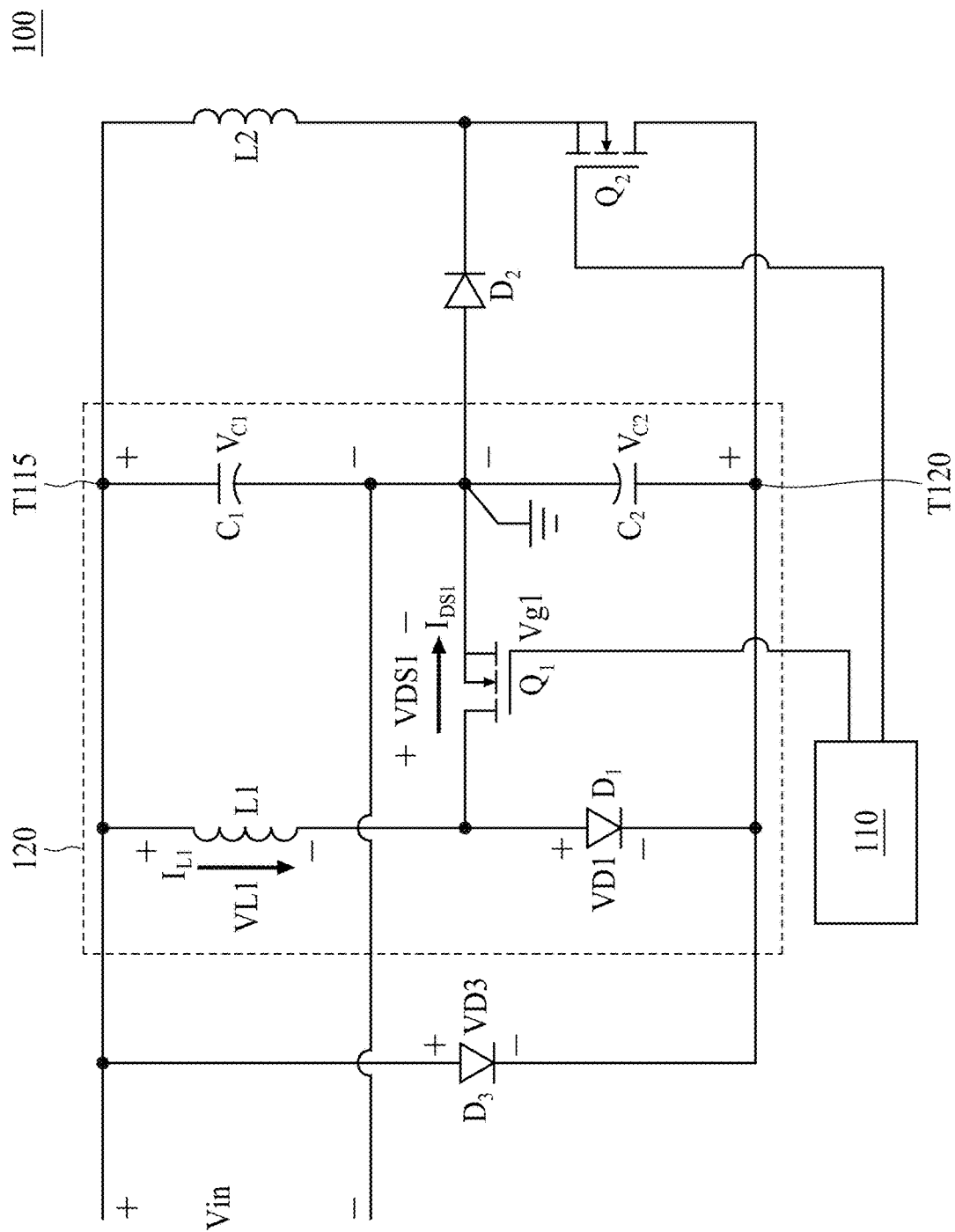
FIG. 2A illustrates a schematic diagram of the testing circuit as illustrated in FIG. 1 operating in a boost circuit mode, in accordance with some embodiments of the present disclosure.
Figure 2B:
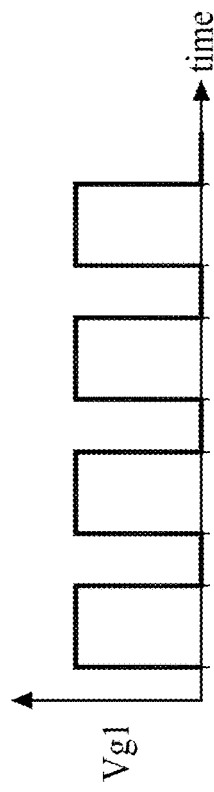
FIG. 2B illustrates a waveform of the voltage at the gate of the transistor of the testing circuit as illustrated in FIG. 2A, in accordance with some embodiments of the present disclosure.
Figure 2C:
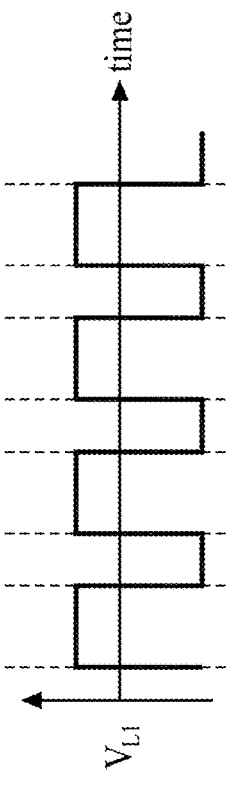
FIG. 2C illustrates a waveform of the voltage across the inductor of the testing circuit as illustrated in FIG. 2A, in accordance with some embodiments of the present disclosure.
Figure 2D:
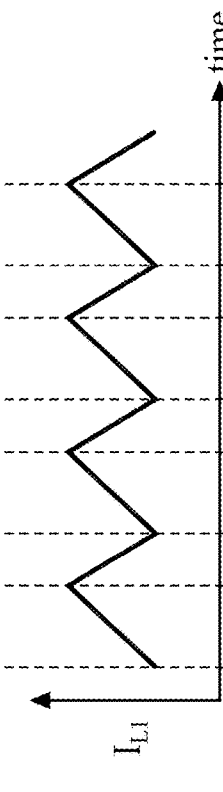
FIG. 2D illustrates a waveform of the current of the inductor of the testing circuit as illustrated in FIG. 2A, in accordance with some embodiments of the present disclosure.
Figure 2E:
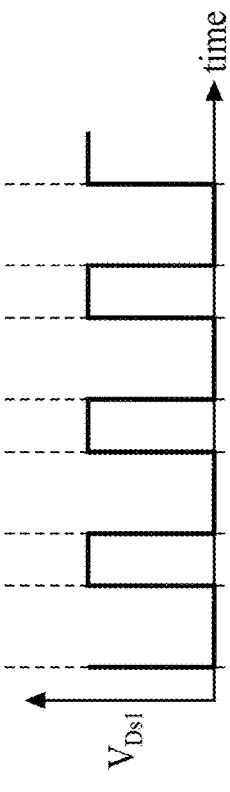
FIG. 2E illustrates a waveform of voltage across the drain and the source of the transistor of the testing circuit 100 as illustrated in FIG. 2A, in accordance with some embodiments of the present disclosure.
Figure 2F:
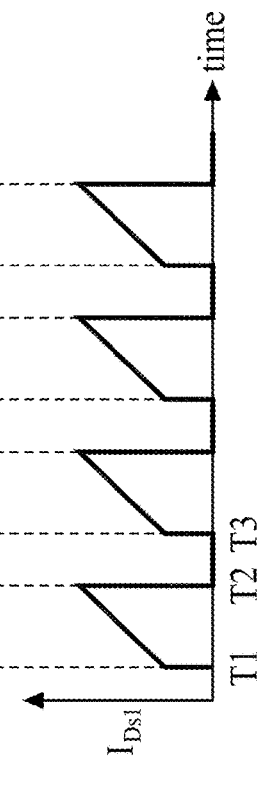
FIG. 2F illustrates a waveform of current flowing through the drain and the source of the transistor of the testing circuit as illustrated in FIG. 2A, in accordance with some embodiments of the present disclosure.

FIG. 2A illustrates a schematic diagram of the testing circuit 100 as illustrated in FIG. 1 operating in a boost circuit mode, in accordance with some embodiments of the present disclosure. FIG. 2B illustrates a waveform of the voltage Vg1 at the gate of the transistor Q1 of the testing circuit 100 as illustrated in FIG. 2A, in accordance with some embodiments of the present disclosure. FIG. 2C illustrates a waveform of the voltage VL1 across the inductor L1 of the testing circuit 100 as illustrated in FIG. 2A, in accordance with some embodiments of the present disclosure. FIG. 2D illustrates a waveform of the current IL1 of the inductor L1 of the testing circuit 100 as illustrated in FIG. 2A, in accordance with some embodiments of the present disclosure. FIG. 2E illustrates a waveform of voltage VDS1 across the drain and the source of the transistor Q1 of the testing circuit 100 as illustrated in FIG. 2A, in accordance with some embodiments of the present disclosure. FIG. 2F illustrates a waveform of current IDS1 flowing through the drain and the source of the transistor Q1 of the testing circuit 100 as illustrated in FIG. 2A, in accordance with some embodiments of the present disclosure.

Referring to FIG. 2A, the testing circuit 100 is configured to test the semiconductor device (e.g., the transistor Q1) operating in the boost circuit mode. For example, the inductor L1, the capacitor C1, the diode D1, the capacitor C2 and the transistor Q1 can function as a boost circuit 120. The terminal (or node) T115 may function as an input of the boost circuit 120. The terminal T120 may function as an output of the boost circuit 120. The capacitor C1 may function as an input capacitor of the boost circuit 120. The capacitor C2 may function as an output capacitor of the boost circuit 120.

In operation, when the testing circuit 100 is in an initiate state (i.e., when the testing device 100 is initially enabled, e.g., prior to the time T1 as shown in FIGS. 2B-2F), the voltage VC2 across the capacitor C2 is zero. The input voltage Vin applies to the testing circuit 100, the diode D3 would be turned on to quickly charge the capacitor C2, so as to raise the voltage VC2 to the voltage input Vin. After the voltage VC2 of the capacitor C2 is substantially equal to the input voltage Vin, the voltage VD3 across the diode D3 is less than the threshold voltage of the diode D3, and the diode D3 is turned off. The diode D3 may function as a soft starter (or a soft enable component) for the testing circuit 100. In addition, since the capacitor C1 is connected to the terminal T115 to receive the input voltage Vin, the voltage VC1 of the capacitor C1 is also charged to be substantially equal to the input voltage Vin.

In other embodiments, the diode D3 may be omitted, and the input voltage Vin would apply to the capacitor C2 through the inductor L1 and the diode D1 in an initiate state. The current IL1 of the inductor L1 starts to increase until the voltage VC2 of the capacitor C2 has been charged to be substantially equal to the input voltage Vin. This may adversely affect the inductor L1. For example, the current IL1 of the inductor L1 would accumulate heat, which may damage the inductor L1.

During the time period between the time T1 and the time T2 as shown in FIG. 2B (X-axis represents time, Y-axis represents the voltage Vg1 at the gate of the transistor Q1), the transistor Q1 is tuned on. For example, the controller 110 is configured to send signal having a logical value "1" to the gate of the transistor Q1 to turn on the transistor Q1. The voltage VDS1 has a lower voltage level (e.g., about 0V) as shown in FIG. 2E (X-axis represents time, Y-axis represents the voltage VDS1 across the drain and the source of the transistor Q1). Meanwhile, the current IDS1 continues to increase as shown in FIG. 2F (X-axis represents time, Y-axis represents the current IDS1 flowing through the drain and the source of the transistor Q1).

The capacitor C1 releases the energy to the inductor L1. The current IL1 of the inductor L1 continues to increase as shown in FIG. 2D (X-axis represents time, Y-axis represents the current IL1 flowing through the inductor L1). In some embodiments, the maximum value of the current IL1 is substantially equal to the maximum value of the current IDS1.

As shown in FIG. 2C (X-axis represents time, Y-axis represents the voltage VL1 across the inductor L1), the voltage VL1 across the inductor L1 has a higher voltage level (e.g., the voltage VC1 across the capacitor C1 or the input voltage Vin). Meanwhile, the diode D1 is in reverse bias since the voltage at the cathode of the diode D1 is substantially equal to the voltage VC2 and the anode of the diode D1 is about 0V.

During the time period between the time T2 and the time T3 as shown in FIG. 2B, the transistor Q1 is turned off. For example, the controller 110 is configured to send signal having a logical value "0" to the gate of the transistor Q1 to turn off the transistor Q1. As shown in FIG. 2F, since the transistor Q1 is turned off, the current IDS1 is changed to zero. Hence, as shown in FIG. 2E, the voltage VDS1 is changed from a lower voltage level to a higher voltage level (e.g., substantially equal to the voltage VC2 across the capacitor C2).

As shown in FIG. 2D, at the time T2, the current IL1 of the inductor L1 reaches a maximum value. Since the current IL1 of the inductor L1 cannot not be suddenly changed as the current IDS1 of the transistor Q1, the current IL1 of the inductor IL1 flows to the capacitor C2 through the diode D1, and the current IL1 of the inductor IL1 gradually decreases during the time period between the time T2 and the time T3 as shown in FIG. 2D. In other words, the inductor L1 starts to charge the capacitor C2 to increase the voltage VC2 of the capacitor C2. In some embodiments, the voltage VC2 is higher than the input voltage Vin.

As shown in FIG. 2C, the voltage VL1 of the inductor L1 changes from a higher voltage level to a lower voltage level at the time T2. The lower voltage level of the inductor L1 is substantially equal to the voltage VC2 across the capacitor C2 minus the voltage VC1 across the capacitor C1. In the case that the forward bias voltage of the diode D1 is taken into consideration, the lower voltage level of the inductor L1 is substantially equal to the voltage VC2 across the capacitor C2 minus the voltage VC1 across the capacitor C1 and the forward bias voltage of the diode D1. In some embodiments, the lower voltage level of the inductor L1 is less than zero during the time period between the time T2 and the time T3.

In accordance with the embodiments as shown in FIGS. 2A to 2F, during the time period from the time T1 to the time T3, the energy stored in the capacitor C1 is transferred to the capacitor C2 through the inductor L1 by controlling the on/off of the transistor Q1. In other words, the voltage VC2 of the capacitor C2 is stepped up during the time period between the time T1 and the time T3. In other words, the voltage at the output terminal (e.g., the terminal T120) is stepped out from the input voltage Vin at the input terminal (e.g., the terminal T115), so as to achieve the boost circuit function.

As shown in FIG. 2A, the testing voltage (i.e., VDS1) applied to the transistor Q1 is substantially equal to the voltage VC2 across the capacitor C2. In some embodiments, a relationship between the input voltage Vin applied to the terminal T115 and the voltage VC2 across the capacitor C2 can be expressed as follows:

$$VC2 = \frac{Vin}{(1-D1)},\qquad \text{Eq. (1)}$$

where D1 is the duty cycle of the signal provided by the controller 110 to the gate of the transistor Q1. For example, the duty cycle D1 is a ratio of the time period when the transistor Q1 is turned on (i.e., the time period between the time T1 and the time T2) to the total time of a period of the signal (i.e., the time period between the time T1 and the time T3). Hence, the voltage VC2 and the testing voltage VDS1 can be adjusted or controlled by changing the duty cycle D1 of the signal provided by the controller 110 without changing the input voltage Vin of the boost circuit 120. This would increase the flexibility and the convenience for testing the transistor Q1.

Figure 3A:
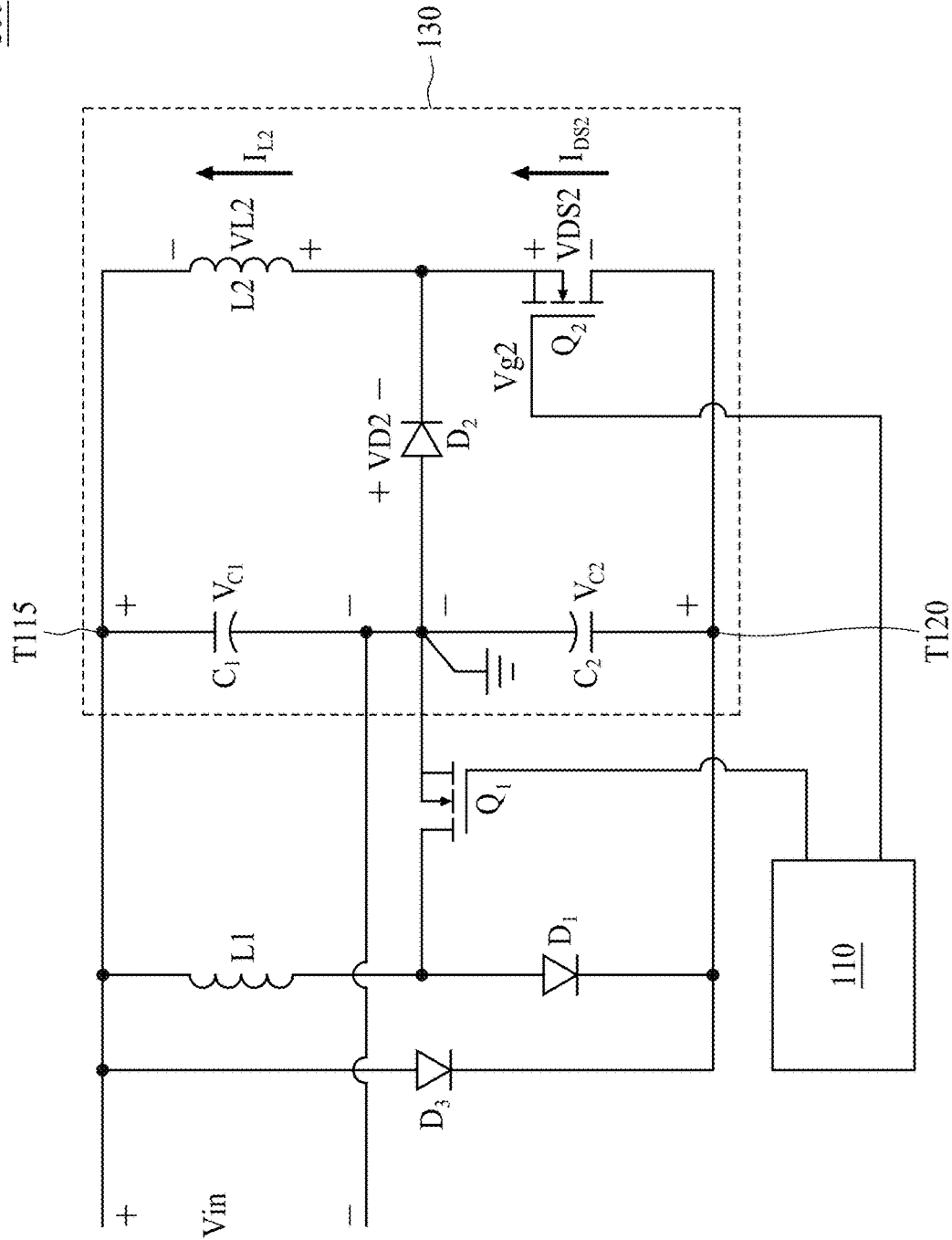
FIG. 3A illustrates a schematic diagram of the testing circuit as illustrated in FIG. 1 operating in a buck circuit mode, in accordance with some embodiments of the present disclosure.
Figure 3B:
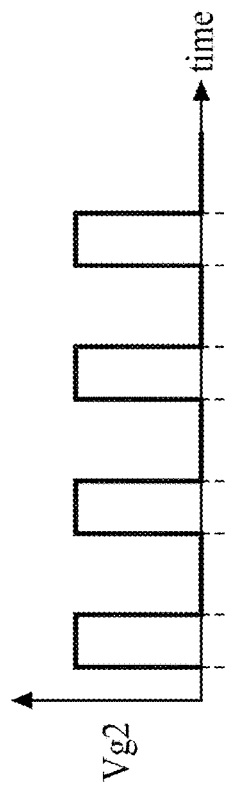
FIG. 3B illustrates a waveform of the voltage at the gate of the transistor of the testing circuit as illustrated in FIG. 3A, in accordance with some embodiments of the present disclosure.
Figure 3C:
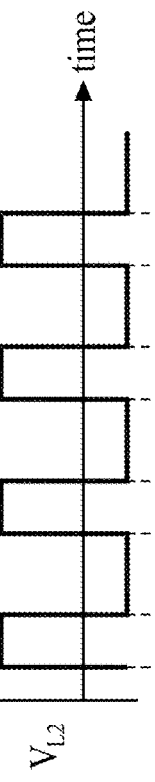
FIG. 3C illustrates a waveform of the voltage across the inductor of the testing circuit as illustrated in FIG. 3A, in accordance with some embodiments of the present disclosure.
Figure 3D:
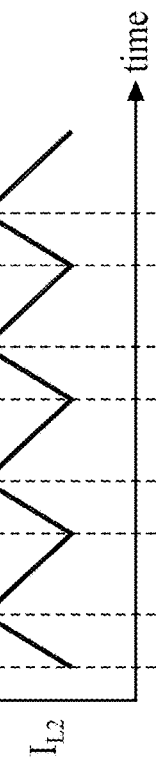
FIG. 3D illustrates a waveform of the current of the inductor of the testing circuit as illustrated in FIG. 3A, in accordance with some embodiments of the present disclosure.
Figure 3E:
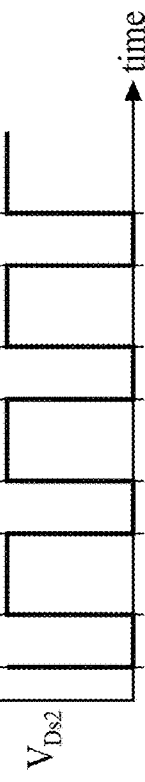
FIG. 3E illustrates a waveform of voltage across the drain and the source of the transistor of the testing circuit as illustrated in FIG. 3A, in accordance with some embodiments of the present disclosure.
Figure 3F:
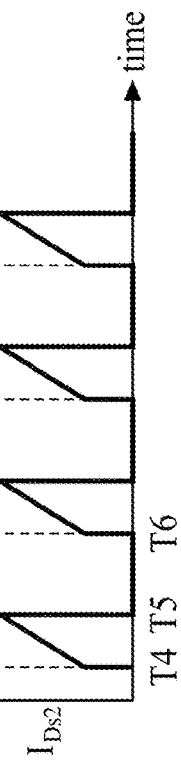
FIG. 3F illustrates a waveform of current flowing through the drain and the source of the transistor of the testing circuit as illustrated in FIG. 3A, in accordance with some embodiments of the present disclosure.

FIG. 3A illustrates a schematic diagram of the testing circuit 100 as illustrated in FIG. 1 operating in a buck circuit mode, in accordance with some embodiments of the present disclosure. FIG. 3B illustrates a waveform of the voltage Vg2 at the gate of the transistor Q2 of the testing circuit 100 as illustrated in FIG. 3A, in accordance with some embodiments of the present disclosure. FIG. 3C illustrates a waveform of the voltage VL2 across the inductor L2 of the testing circuit 100 as illustrated in FIG. 3A, in accordance with some embodiments of the present disclosure. FIG. 3D illustrates a waveform of the current IL2 of the inductor L2 of the testing circuit 100 as illustrated in FIG. 3A, in accordance with some embodiments of the present disclosure. FIG. 3E illustrates a waveform of voltage VDS2 across the drain and the source of the transistor Q2 of the testing circuit 100 as illustrated in FIG. 3A, in accordance with some embodiments of the present disclosure. FIG. 3F illustrates a waveform of current IDS2 flowing through the drain and the source of the transistor Q2 of the testing circuit 100 as illustrated in FIG. 3A, in accordance with some embodiments of the present disclosure.

Referring to FIG. 3A, the testing circuit 100 is configured to test the semiconductor device (e.g., the transistor Q2) operating in the buck circuit mode. For example, the inductor L2, the capacitor C1, the diode D2, the capacitor C2 and the transistor Q2 can function as a buck circuit 130. The terminal (or node) T120 may function as an input of the buck circuit 130. The terminal V115 may function as an output of the buck circuit 130. The capacitor C2 may function as an input capacitor of the buck circuit 130. The capacitor C1 may function as an output capacitor of the buck circuit 130.

In operation, during the time period between the time T4 and the time T5 as shown in FIG. 3B, the transistor Q2 is tuned on. For example, the controller 110 is configured to send signal having a logical value "1" to the gate of the transistor Q2 to turn on the transistor Q2. The voltage VDS2 has a lower voltage level (e.g., about 0V) as shown in FIG. 3E (X-axis represents time, Y-axis represents the voltage VDS2 across the drain and the source of the transistor Q2). Meanwhile, the current IDS2 continues to increase as shown in FIG. 3F (X-axis represents time, Y-axis represents the current IDS2 flowing through the drain and the source of the transistor Q2).

The capacitor C2 releases the energy stored during the boost circuit mode (e.g., during the time period between the time T1 and the time T3) to the inductor L2 through the transistor Q2. The current IL2 flowing through the inductor L2 continues to increase as shown in FIG. 3D (X-axis represents time, Y-axis represents the current IL2 flowing through the inductor L2). In some embodiments, the maximum value of the current IL2 is substantially equal to the maximum value of the current IDS2.

As shown in FIG. 3C (X-axis represents time, Y-axis represents the voltage VL2 across the inductor L2), the voltage VL2 across the inductor L2 has a higher voltage level. In some embodiments, the higher voltage level is substantially equal to the voltage VC2 across the capacitor C2 minus the voltage VC1 across the capacitor C1. Since the voltage VC2 is higher than the voltage VC1, the voltage VL2 of the inductor L2 is higher than zero, and the current IL2 of the inductor L2 continues to increase as shown in FIG. 3D.

During the time period between the time T5 and the time T6, the transistor Q2 is turned off. For example, the controller 110 is configured to send signal having a logical value "0" to the gate of the transistor Q2 to turn off the transistor Q2. Hence, the current IDS2 of the transistor Q2 changes to zero as shown in FIG. 3F, and the voltage VDS2 of the transistor Q2 changes from a lower voltage level to a higher voltage level as shown in FIG. 3E. In some embodiments, the higher voltage level of the voltage VDS2 is substantially equal to the voltage VC2 across the capacitor C2. In the case that the forward bias voltage of the diode D2 is taken into consideration, the voltage VDS2 may be substantially equal to the voltage VC2 across the capacitor C2 minus the forward bias voltage of the diode D2.

The inductor L2 starts to charge the capacitor C1 to increase the voltage VC1 of the capacitor C1. For example, the current IL2 flows through the diode D2 and the inductor L2 to charge the capacitor C1. Hence, as shown in FIG. 3D, the current IL2 decreases from the time T5 to the time T6. As shown in FIG. 3C, the voltage VL2 of the inductor changes to a lower voltage level. In some embodiments, the lower voltage level of the inductor L2 is substantially equal to the voltage VC1 of the capacitor C1. In the case that the forward bias voltage of the diode D2 is taken into consideration, the lower voltage level of the inductor L2 is substantially equal to the voltage VC1 of the capacitor C1 minus the forward bias voltage of the diode D2.

In accordance with the embodiments as shown in FIGS. 3A to 3F, during the time period from the time T4 to the time T6, the energy stored in the capacitor C2 is transferred to the capacitor C1 through the inductor L2 by controlling the on/off of the transistor Q2. In other words, the voltage VC1 of the capacitor C1 is stepped up during the time period from the time T4 to the time T6. In other words, the voltage VC2 of the capacitor C2 is stepped down during the time period from the time T4 to the time T6.

As shown in FIG. 3A, the testing voltage (i.e., VDS2) applied to the transistor Q2 is substantially equal to the voltage VC2 across the capacitor C2. In some embodiments, a relationship between the input voltage Vin applied to the terminal T115 and the voltage VC2 across the capacitor C2 can be expressed as follows:

$$VC2 = \frac{Vin}{D2},\qquad \text{Eq. (2)}$$

where D2 is the duty cycle of the signal provided by the controller 110 to the gate of the transistor Q2. For example, the duty cycle D2 is a ratio of the time period when the transistor Q2 is turned on (i.e., the time period between the time T4 and the time T5) to the total time of a period of the signal (i.e., the time period between the time T4 and the time T6). Hence, the voltage VC2 and the testing voltage VDS2 can be adjusted or controlled by changing the duty cycle D2 of the signal provided by the controller 110 without changing the input voltage Vin of the buck circuit 130. This would increase the flexibility and the convenience for testing the transistor Q2.

In some embodiments, to achieve the minimum power loss, the voltage VC2 across the capacitor C2 during the boost circuit mode can be equal to the voltage VC2 across the capacitor C2 during the buck circuit mode. Hence, according to the equations Eq. (1) and Eq. (2), the duty cycle D2 can be substantially equal to 1 minus the duty cycle D1.

In the case that the duty cycle D2 is larger than the duty cycle D1, the time for transferring the energy stored in the capacitor C2 to the inductor L2 during the buck circuit mode increases while the time for transferring the energy stored in the inductor L2 to the capacitor C1 the buck circuit mode decreases. Hence, the current IL2 (which is substantially equal to the current IDS2 conducted by the transistor Q2) of the inductor L2 would increase, which would in turn increase the energy transferred from the capacitor C2 to the capacitor C1. As the energy of the capacitor C1 increases, the current IL1 (which is substantially equal to the current IDS1 conducted by the transistor Q1) of the inductor L1 during the boost circuit mode increases as well. Therefore, the testing current (e.g., the current IDS1 conducted by the transistor Q1 and the current IDS2 conducted by the transistor Q2) can be easily controlled by adjusted the duty cycle D1 or the duty cycle D2.

In accordance with the embodiments as shown in FIGS. 2A~3F, the testing circuit 100 may include both a boost circuit (e.g., the boost circuit 120) and a buck circuit (e.g., the buck circuit 130) to perform the boost circuit test and the buck circuit test. During the boost circuit mode (e.g., the time period between the time T1 and the time T3 as shown in FIGS. 2A~2F), the energy stored in the capacitor C1 can be transferred to the capacitor C2. During the buck circuit mode (e.g., the time period between the time T4 and the time T6 as shown in FIGS. 3A~3F), the energy stored in the capacitor C2 can be transferred to the capacitor C1. Hence, there is almost no power loss during the entire testing procedure (e.g., the boost circuit test and the buck circuit test), and only a small amount of power is required at the input (e.g., the terminal T115) of the testing circuit 100 to maintain the basic operation of the testing circuit 100.

In addition, since no electronic load or resistive load is required at the output terminal (e.g., the terminal T120) of the testing circuit 100, the power consumption of the testing circuit 100 can be further reduced, which would in turn reduce the heat generated by the testing circuit 100 during the testing procedure. Hence, the testing circuit 100 is suitable for the aging test for a semiconductor device which is required to be operated in a closed environment for an extended period of time.

Furthermore, during the boost circuit mode and the buck circuit mode, the transistors Q1 and Q2 are configured to keep being turned on and off. In other words, the transistors Q1 and Q2 are operating in the hard switching state during the testing procedure, rendering the voltage and the current stress of the transistors Q1 and Q2 relatively harsh. Hence, the testing circuit 100 can be used for performing the SSOA test for semiconductor devices. In particularly, for group III nitride devices (e.g., GaN transistors), the SSOA test is relatively important, and thus the testing circuit 100 is suitable for performing the SSOA test on group III nitride devices.

In view of the above, the testing circuit 100 as illustrated in FIG. 1 may be configured to perform a boost circuit test, a buck circuit test, an aging test and a SSOA test for semiconductor devices. This would reduce the time, cost and complexity of testing the semiconductor devices.

Figure 4A:
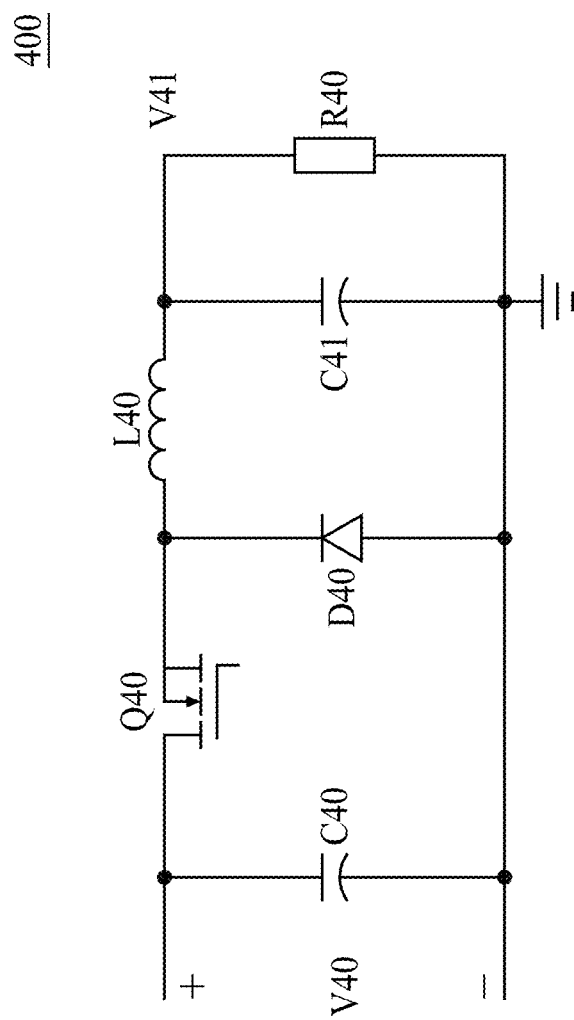
FIG. 4A illustrates a schematic diagram of a boost circuit, in accordance with some embodiments of the present disclosure.
Figure 4B:
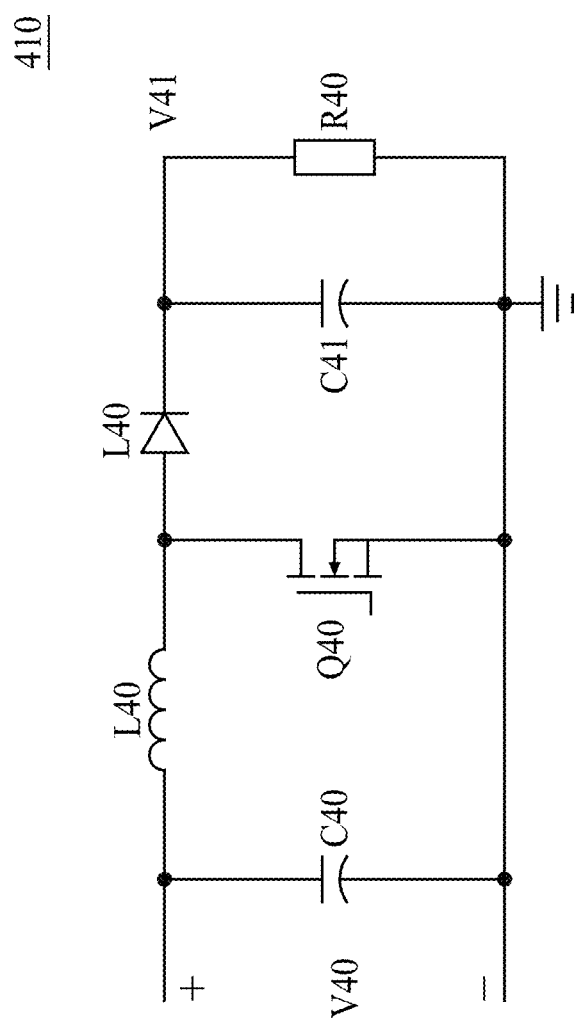
FIG. 4B illustrates a schematic diagram of a buck circuit, in accordance with some embodiments of the present disclosure.
Figure 4C:
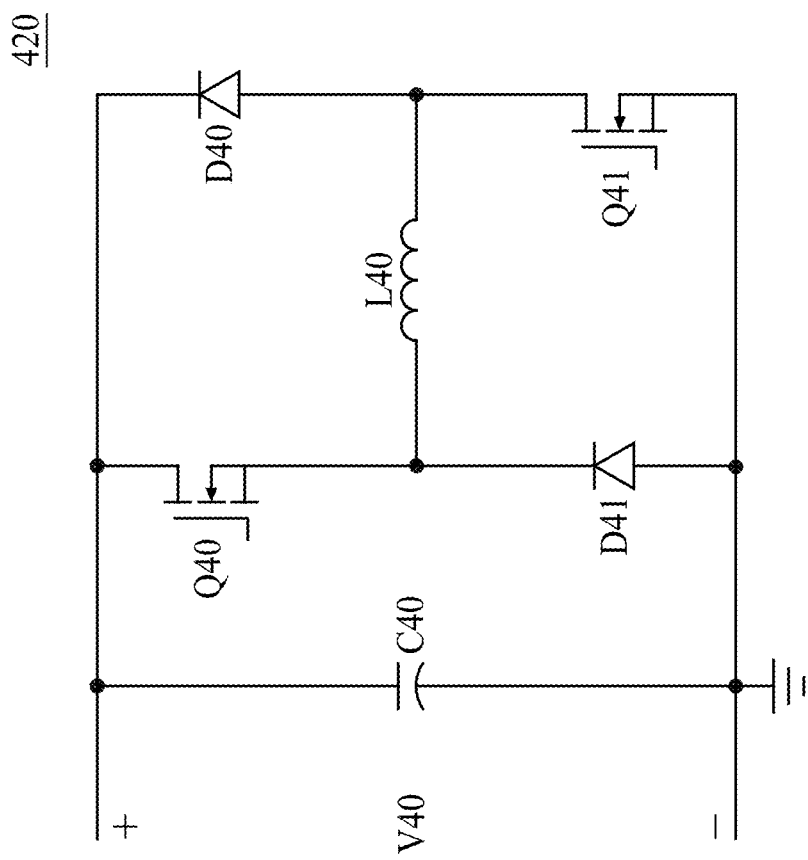
FIG. 4C illustrates a schematic diagram of an aging test circuit, in accordance with some embodiments of the present disclosure.
Figure 4D:
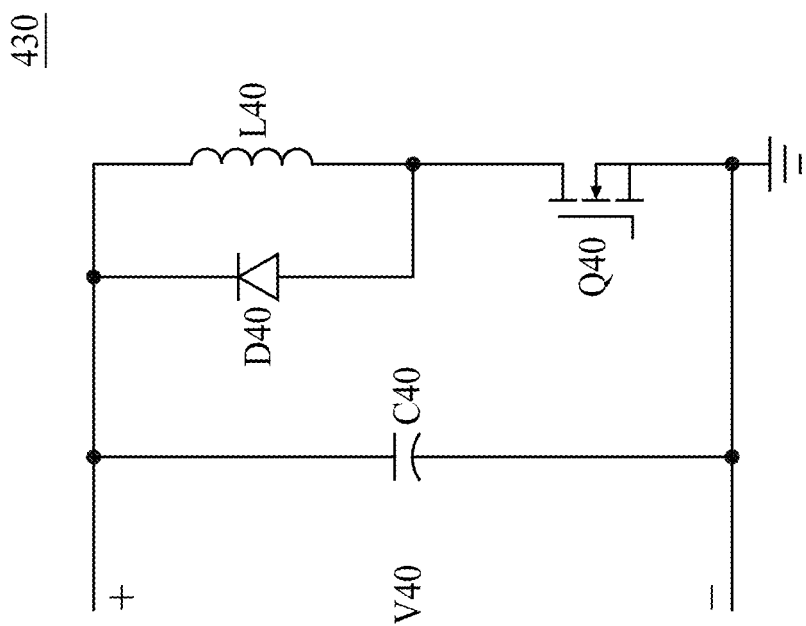
FIG. 4D illustrates a schematic diagram of a double pulse test circuit, in accordance with some embodiments of the present disclosure.

In other embodiments, the boost circuit test, the buck circuit test, the aging test and the SSOA test can be performed by separate testing circuits. For example, FIG. 4A illustrates a schematic diagram of a boost circuit 400 configured to perform a boost circuit test. FIG. 4B illustrates a schematic diagram of a buck circuit 410 configured to perform a buck circuit test. FIG. 4C illustrates a schematic diagram of an aging test circuit 420 configured to perform an aging test. FIG. 4D illustrates a schematic diagram of a double pulse test circuit 430 configured to perform a SSOA test.

As shown in FIG. 4A, the boost circuit 400 includes capacitors C40, C41, a diode D40, an inductor L40, and an output load R40. The boost circuit 400 is connected to a device to be tested (i.e., a transistor Q40). The transistor Q40 has a drain connected to the capacitor C40 and a source connected to the inductor L40 and a cathode of the diode D40. The capacitor C40 is connected between the input of the boost circuit 400 and ground. The anode of the diode is connected to ground. The inductor L40 is connected between the transistor Q40 and the output of the boost circuit 400. The capacitor C41 is connected between the output of the boost circuit 400 and ground. The output load R40 is connected between the output of the boost circuit 400 and ground. The boost circuit 400 is configured to step up the output voltage V41 from the input voltage V40 and to perform a boost circuit test for the transistor Q40.

However, the boost circuit 400 cannot be used to perform a buck circuit test. In addition, since the boost circuit 400 has a resistive load (i.e., the output load R40) at the output of the boost circuit 400, the power consumption and the heat of the boost circuit 400 is relatively larger compared with the testing circuit 100 as shown in FIG. 1. Hence, the boost circuit 400 is not suitable for the aging test. Furthermore, the testing current (i.e., the current flowing through the transistor Q40) and the testing voltage (i.e., the voltage across the drain and the source of the transistor Q40) should be controlled by adjusting the input voltage V40 and the output load R40, which would reduce the flexibility for testing.

As shown in FIG. 4B, the buck circuit 410 includes capacitors C40, C41, a diode D40, an inductor L40, and an output load R40. The buck circuit 410 is connected to a device to be tested (i.e., a transistor Q40). The transistor Q40 has a drain connected to the inductor L40 and an anode of the diode D40. The transistor Q40 has a source connected to ground. The capacitor C40 is connected between the input of the buck circuit 410 and ground. The inductor L40 is connected between the drain of the transistor Q40 and the input of the buck circuit 400. The capacitor C41 is connected between the output of the buck circuit 410 and ground. The output load R40 is connected between the output of the buck circuit 410 and ground. The buck circuit 410 is configured to step down the output voltage V41 from the input voltage V40 and to perform a buck circuit test for the transistor Q40.

However, the buck circuit 410 cannot be used to perform a boost circuit test. In addition, since the buck circuit 410 has a resistive load (i.e., the output load R40) at the output of the buck circuit 410, the power consumption and the heat of the buck circuit 410 is relatively larger compared with the testing circuit 100 as shown in FIG. 1. Hence, the buck circuit 410 is not suitable for the aging test. Furthermore, the testing current (i.e., the current flowing through the transistor Q40) and the testing voltage (i.e., the voltage across the drain and the source of the transistor Q40) should be controlled by adjusting the input voltage V40 and the output load R40, which would reduce the flexibility for testing.

As shown in FIG. 4C, the aging test circuit 420 includes a capacitor C40, diodes D40, D41 and an inductor L40. The aging test circuit 420 is connected to devices to be tested (i.e., transistors Q40 and Q41). The transistor Q40 has a drain connected to the input of the aging test circuit 420, the capacitor C40 and a cathode of the diode D40. The transistor Q40 has a source connected to the inductor L40 and a cathode of the diode D41. The transistor Q41 has a drain connected to the inductor L40 and an anode of the diode D40. The transistor Q41 has a source connected to ground. The capacitor C40 is connected between the input of the aging test circuit 420 and ground. The aging test circuit 420 is configured to turn on/off the transistors Q40 and Q41, so as to perform an aging test for the transistors Q40 and Q41.

Since no resistive load is required at the output of the aging test circuit 420, the power consumption of the aging test circuit 420 is relatively low compared with the boost circuit 400 and the buck circuit 410, which renders the aging test circuit 420 suitable for performing the aging test. However, the aging test circuit 420 cannot be used to perform a boost circuit test and a buck circuit test. In addition, the testing voltage (i.e., the voltage across the drain and the source of each of the transistors Q40 and Q41) should be controlled by adjusting the input voltage V40, and an additional current source is required for adjusting the testing current (i.e., the current flowing through each of the transistors Q40 and Q41), which would reduce the flexibility for testing.

As shown in FIG. 4D, the double pulse test circuit 430 includes a capacitor C40, a diode D40 and an inductor L40. The double pulse test circuit 430 is connected to a device to be tested (i.e., transistor Q40). The transistor Q40 has a drain connected to the inductor L40 and an anode of the diode D40. The transistor Q40 has a source connected to ground. The capacitor C40 is connected between the input of the double pulse test circuit 430 and ground. The cathode of the diode D40 is connected to the input of the double pulse test circuit 430. The double pulse test circuit 430 is configured to turn on/off the transistor Q40, so as to perform a SSOA test for the transistor Q40.

However, the double pulse test circuit 430 cannot be used to perform a buck circuit test. In addition, the testing voltage (i.e., the voltage across the drain and the source of the transistor Q40) should be controlled by adjusting the input voltage V40, and an additional current source is required for adjusting the testing current (i.e., the current flowing through the transistor Q40), which would reduce the flexibility for testing.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A testing circuit, comprising:
    a first circuit having a first capacitor and a second capacitor, the first circuit configured to transfer at least a portion of a first voltage across the first capacitor to the second capacitor; and
    a second circuit having the first capacitor and the second capacitor, the second circuit configured to transfer at least a portion of a second voltage across the second capacitor to the first capacitor; wherein
    the first circuit is connected to a first transistor to be tested;
    the first transistor has a gate configured to receive a first pulse signal; and
    the portion of the first voltage is transferred from the first capacitor to the second capacitor during a period of the first pulse signal;
    the second circuit is connected to a second transistor to be tested;
    the second transistor has a gate configured to receive a second pulse signal; and
    the portion of the second voltage is transferred from the second capacitor to the first capacitor during a period of the second pulse signal;
    further comprising:
    a first inductor having a first terminal connected to an input of the testing circuit and a second terminal connected to a drain of the first transistor; and
    a first diode having an anode connected to the second terminal of the first inductor and a cathode connected to a first terminal of the second capacitor,
    wherein the second capacitor has a second terminal connected to ground,
    wherein the first capacitor has a first terminal connected to the input of the testing circuit and a second terminal connected to ground, and
    wherein the first transistor has a source connected to ground.

2. The testing circuit of claim 1, wherein
    the first pulse signal has a first duty cycle;
    the second pulse signal has a second duty cycle; and
    the first duty cycle is substantially equal to 1 minus the second duty cycle.

3. The testing circuit of claim 1, wherein
    in the case that the first transistor is turned on, the first capacitor is configured to release energy to the first inductor to increase a first current of the first inductor; and
    in the case that the first transistor is turned off, the first inductor is configured to charge the second capacitor to increase the second voltage of the second capacitor.

4. The testing circuit of claim 3, wherein
    in the case that the first transistor is turned on, the first current flows from the first inductor through the first transistor to ground; and
    in the case that the first transistor is turned off, the first current flows from the first inductor through the first diode to the second capacitor.

5. The testing circuit of claim 1, wherein the second circuit further comprises:
    a second inductor having a first terminal connected to an input of the testing circuit and a second terminal connected to a source of the second transistor; and
    a second diode having an anode connected to ground and a cathode connected to the second terminal of the second inductor,
    wherein the second capacitor has a first terminal connected to a drain of the second transistor and a second terminal connected to ground, and
    wherein the first capacitor has a first terminal connected to the input of the testing circuit and a second terminal connected to ground.

6. The testing circuit of claim 5, wherein
    in the case that the second transistor is turned on, the second capacitor is configured to release energy to the second inductor to increase a second current of the second inductor; and
    in the case that the second transistor is turned off, the second inductor is configured to charge the first capacitor to increase the first voltage of the first capacitor.

7. The testing circuit of claim 6, wherein
    in the case that the second transistor is turned on, the second current flows from the second capacitor through the second transistor to the second inductor; and
    in the case that the second transistor is turned off, the second current flows from the second diode through the second inductor to the first capacitor.

8. The testing circuit of claim 1, wherein the first circuit is configured to perform at least one of: a boost circuit test, an aging test and a switching safe operating area (SSOA) test for the first transistor.

9. The testing circuit of claim 1, wherein the second circuit is configured to perform at least one of: a buck circuit test, an aging test and a SSOA test for the second transistor.

10. The testing circuit of claim 1, wherein
    the gate of the first transistor is connected to a pulse width modulation (PWM) controller and configured to receive the first pulse signal from the PWM controller; and
    the gate of the second transistor is connected to the PWM controller and configured to receive the second pulse signal from the PWM controller.

11. The testing circuit of claim 1, wherein the first transistor and the second transistor include group III nitride transistors.

12. The testing circuit of claim 7, further comprising a third diode connected between an input of the testing circuit and the second capacitor.

13. A method for testing a first transistor and a second transistor, comprising:
    providing the testing circuit of claim 1;
    performing a boost circuit test for the first transistor during a first time period by transferring at least a portion of the first voltage of the first capacitor to the second capacitor; and
    performing a buck circuit test for the second transistor during a second time period by transferring at least a portion of the second voltage of the second capacitor to the first capacitor.

14. The method of claim 13, wherein
    the first transistor has a gate configured to receive a first pulse signal during the first time period; and
    the second transistor has a gate configured to receive a second pulse signal during the second time period.

15. The method of claim 14, wherein
    the first pulse signal has a first duty cycle;
    the second pulse signal has a second duty cycle; and
    the first duty cycle is substantially equal to 1 minus the second duty cycle.

16. The method 13, wherein
    the first transistor is turned on and turned off during the first time period; and the second transistor is turned on and turned off during the second time period.

17. The method of claim 13, further comprising:
performing an aging test and a switching safe operating area (SSOA) test for the first transistor; and
performing the aging test and the SSOA test for the second transistor.

* * * * *